US005175472A

United States Patent [19]

Johnson, Jr. et al.

[11] Patent Number: 5,175,472

[45] Date of Patent: Dec. 29, 1992

[54] POWER MONITOR OF RF PLASMA

[75] Inventors: Theodore E. Johnson, Jr., South Hamilton; Paul W. Rummel, Lynn, both of Mass.

[73] Assignee: Comdel, Inc., Beverly, Mass.

[21] Appl. No.: 814,433

[22] Filed: Dec. 30, 1991

[51] Int. Cl.[5] .......... H05H 1/24; H03H 7/38

[52] U.S. Cl. .......... 315/111.21; 313/231.31; 333/32

[58] Field of Search .......... 315/111.21, 111.81; 313/231.31; 331/74; 333/32, 99 PL

[56] References Cited

U.S. PATENT DOCUMENTS 4,207,137 6/1980 Tretola .......... 156/627
4,579,618 4/1986 Celestino et al. .......... 156/345
4,622,094 11/1986 Otsubo .......... 156/627
4,629,940 12/1986 Gagne et al. .......... 315/111.21 X
4,935,661 6/1990 Heinecke et al. .......... 315/111.21 X
4,956,582 9/1990 Bourassa .......... 315/111.21

*Primary Examiner*—Eugene R. LaRoche
*Assistant Examiner*—Do Hyum Yoo
*Attorney, Agent, or Firm*—Thomas N. Tarrant

[57] ABSTRACT

An RF plasma power monitor that monitor voltage, current and DC bias adjacent the plasma load and processes the sensed data in a digital data processor to provide true power at the load. Provision is also made for the control of an RF power source to maintain power at the load at a preset level irrespective on impedance fluctuations and reflections.

13 Claims, 2 Drawing Sheets

POWER MONITOR OF RF PLASMA

BACKGROUND OF THE INVENTION

1. Field of the Invention

The invention relates to RF plasma producing apparatus used in etching or deposition processes and in particular to apparatus and methods for the monitoring and control of such plasma producing apparatus.

2. Description of the Prior Art

Present RF plasma technology maintains a constant indicated forward power at the RF source, regardless of mismatch reflections, transmission line losses, nonrepeatable impedance matching losses, reactor feed losses and RF envelope modulation due to plasma load nonlinearities interacting with power source instabilities. Process diagnostics is often reduced to a guessing game once gas flow and pressure controls are checked against each other. One use of RF plasmas is the etching of semiconductor materials to define circuit parameters in the electronics industry.

SUMMARY OF THE INVENTION

Now, in accordance with the present invention, apparatus and method has been provided to sense voltage and current at or near the RF load. The RF voltage and current are reduced in frequency to one megahertz or less, converted to true RMS values which are in turn converted to digital signals and fed to a digital data processor. The RF voltage and current are also multiplied together and integrated to provide a signal proportional to RF power. This RF power signal is also converted to digital and provided to the data processor. The data processor is programmed to correct for variables introduced in the monitoring circuits and calculates and displays the true values of RF voltage, RF current, RF power, plasma load impedance and phase angle at the point of the sensor unit. The data processor also provides an output signal operable as a feedback control to the RF power source to maintain constant power, constant RMS voltage, constant RMS current or constant DC bias voltage at the point of the sensor unit irrespective of load impedance.

Thus it is an object of the invention to provide a power monitor for control of RF plasma processing.

Further objects of the invention will become apparent upon reading the following description together with the drawing.

DESCRIPTION OF THE PREFERRED EMBODIMENT

Figure 1:
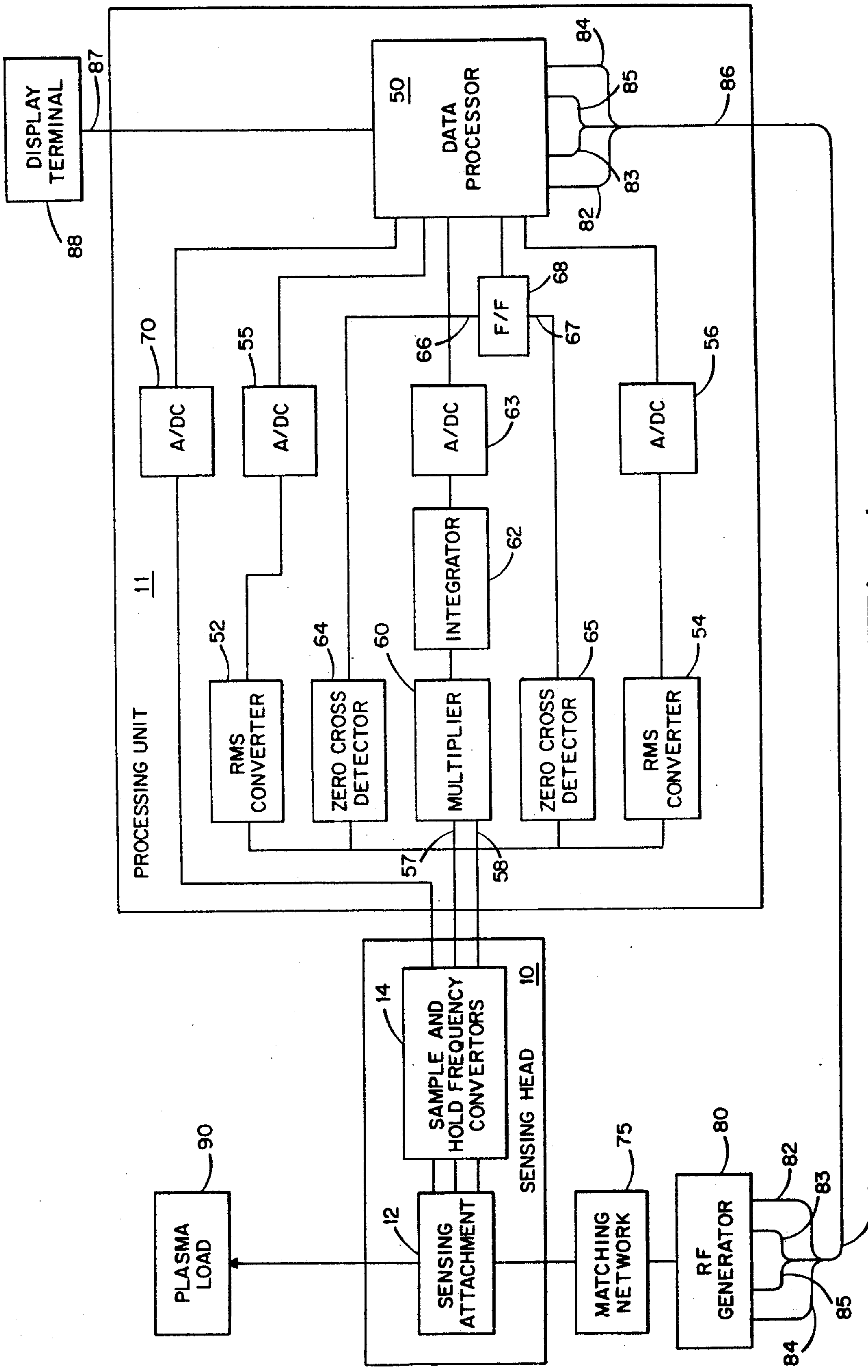
FIG. 1 is a block diagram of the inventive power monitor.

A block diagram of the RF plasma power monitor is depicted in FIG. 1. The power monitor has two basic modules, sensing head 10 and processing unit 11. Sensing head 10 is made in two separable units, sensing attachment 12 and sample and hold frequency converters 14. Units 12 and 14 plug solidly together, but are made separable so that the sensing attachment may be changed to accomodate wide variations in plasma power level.

Figure 2:
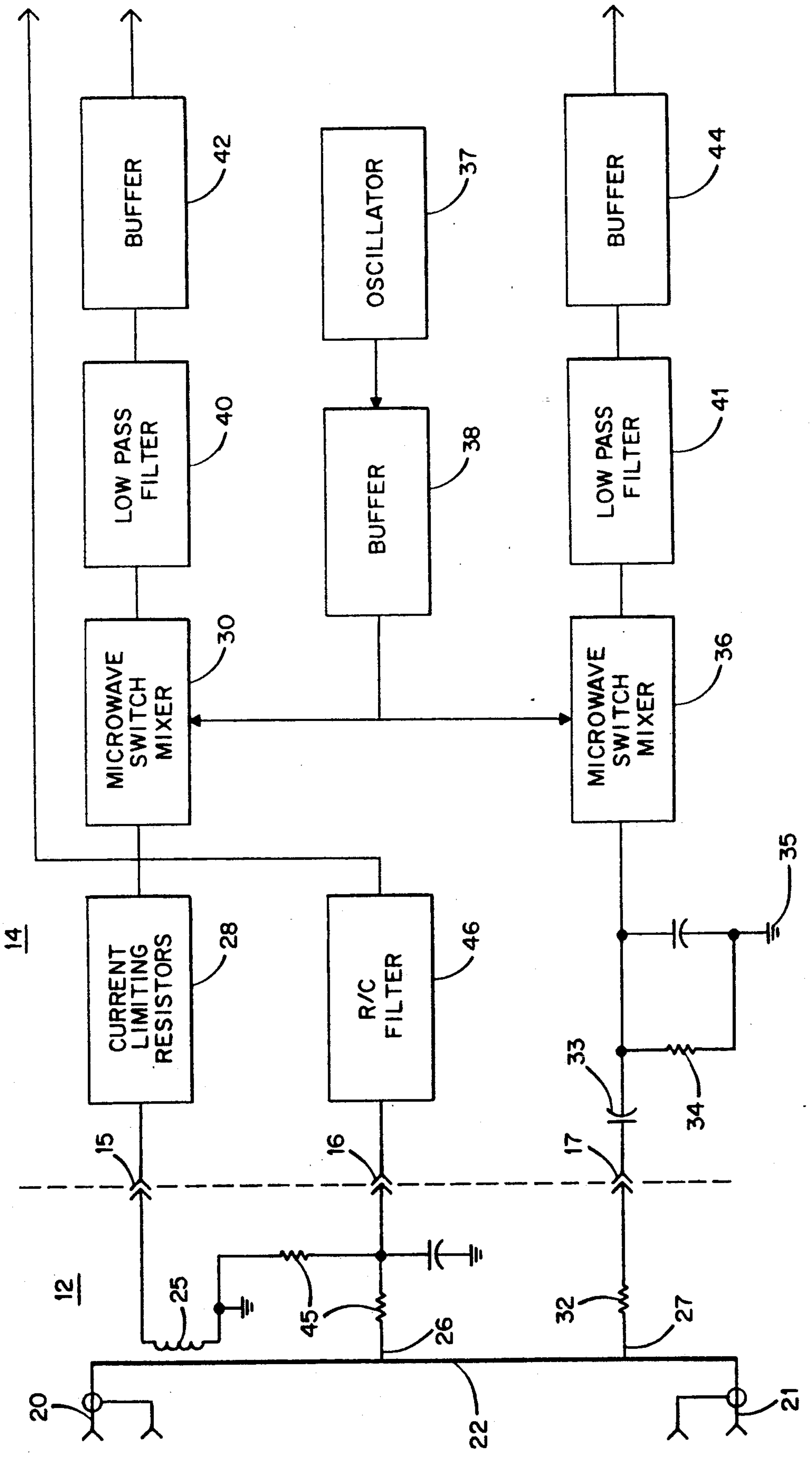
FIG. 2 is a diagram partially schematic and partially block of the power monitor sensor head.

Sensing attachment 12 is shown in greater electrical detail in FIG. 2. Sensing attachment 12 is connected to frequency converters 14 by three RF connectors, 15, 16 and 17. Sensing attachment 12 may be in the form of a rectangular aluminum box containing the sensing components. Two further RF connectors, 20 and 21 are for connecting to a load and an RF power source.

RF conductor 22 is mounted between connectors 20 and 21. Conductor 22 is suitably a rod of metal that may be as large as ⅜ inch or more in diameter depending on the RF power range being handled. A bare single conductor has been used and has been insulated from the enclosure and connected to central terminals of connectors 20 and 21.

Three sensing taps, 25, 26 and 27, are made to conductor 22. Tap 25 is a toroid transformer encircling conductor 22 so that conductor 22 acts as the transformer primary. Taps 26 and 27 are soldered, brazed or otherwise directly electrically and physically connected to conductor 22. Tap 27 could be connected capacitively.

Tap 25 senses the RF current in conductor 22. Tap 26 senses the DC bias level on conductor 22 and thus at the plasma load. Tap 27 senses the RF voltage on conductor 22. Tap 25 is connected by RF connector 15 through current limiting resistors 28 to microwave-switch-mixer 30.

Tap 27 is connected through resistor 32, RF connector 17 and capacitor 33 to resistor 34 which in turn is connected to ground reference 35. Resistors 32 and 34 act as a voltage divider while capacitor 33 is for DC blocking. The junction of capacitor 33 and resistor 34 is connected to microwave-switch-mixer 36.

Oscillator 37 is a precision frequency source together with frequency dividers or multipliers as needed to provide a square wave at the frequency of the RF power source plus a frequency offset. Buffer 38 provides a high impedance to the oscillator and provides fast fall and rise times at its output. Buffer 38 is connected to both microwave-switch-mixers 30 and 36. Gallium arsenide microwave switches have been used. Low pass filters 40 and 41 connected to the outputs of mixers 30 and 36 respectively, filter out most of the higher frequencies, leaving the difference frequency predominant.

This is not the conventional mixing action, but rather a "sample and hold" action in which the microwave switches are turned on and off periodically by the square wave output from the oscillator. Each time a switch is turned on, its output is held in the capacitors of the low pass filter.

Buffers 42 and 44 are high input impedance amplifiers, suitably operational amplifiers, that provide both gain and further reduction of high frequency components.

The remaining tap, 26, has the sole purpose of sensing any DC voltage buildup on the line to plasma load 90. Resistors 45 are a voltage divider the output of which is connected through RF connector 16 to R/C filter 46. R/C filter 46 removes the RF voltage riding on the DC voltage.

The above describes the circuitry of sensing head 10. Sensing head 10 senses the voltages and current on the plasma load line and reduces all significant frequency components to 1 mhz or less for easy processing. The output of sensing head 10 is connected to processing unit 11, suitably by a flexible cable.

The components of processing unit 11 are known state-of-the-art devices with little need of detailed description. The following description is with reference to FIG. 1. The heart of processing unit 11 is data processor 50 which can be a small general purpose computer specially programmed for this purpose.

The outputs of buffers 42 and 44 are connected to RMS converters 52 and 54 respectively. The outputs of RMS converters 52 and 54 are then connected through analog-to-digital converters 55 and 56 respectively to digital input ports of processor 50.

The outputs of buffers 42 and 44 are also connected to inputs 56 and 58 of multiplier 60 which multiplies these two signals together. The output of multiplier 60 is connected to the input of integrator 62 to provide an average DC level representative of RF power. The output of integrator 62 is connected through analog-to-digital converter 63 to data processor 50. These connections may include an adjustable gain buffer amplifier preferably connected between integrator 62 and converter 63.

The outputs of buffers 42 and 44 are still further connected to the inputs of zero cross detectors 64 and 65 respectively. Detectors 64 and 65 are connected to inputs 66 and 67 respectively of flip-flop 68. The purpose of this circuit is to determine whether the RF voltage leads or lags the RF current. The output of flip-flop 68 is connected to a digital input of data processor 50 and is used to assign the sign to the impedance phase calculations. The output of R/C filter 46 (FIG. 2) is connected through Analog-to-Digital Converter 70 to data processor 50.

In the usual monitoring setup, RF generator 80 includes sensors for sensing forward power and reflected power. Forward power is connected out to processor 50 by lead 82 while reflected power is connected by lead 83. Processor 50 provides output 84 to enable RF generator 80 and output 85 to set the power output level of generator 80. All these connection leads are shown as going through common cable 86.

Output connection 87 from data processor 50 goes to display terminal 88. Display terminal 88 may be a video display or a simple digital character display. The display may be continuous, sequential or responsive to commands from a keyboard which may be part of display terminal 88.

In manufacture each unit is tested and the data processor adjusted to provide the necessary correction factors for true readings.

One use is in plasma etching using an RF plasma frequency of 13.56 MHZ. An oscillator frequency of 13.585 MHZ has been used providing a monitor processing frequency of 25 KHZ.

The sensing attachment is connected between RF matching network 75 and plasma load 90 by connectors 20 and 21. The connection being made as close to plasma load 90 as convenient. The closer to load 90, the more accurate this monitoring. Data processor 50 is set to provide a specific power level to plasma load 90 and sends an enable signal to start the flow of RF power. The RF current and voltage are sensed and reduced in frequency in sensor head 10. Then multiplier 60 multiplies the two together to provide a signal representing RF power. This signal is then converted to digital and processed in data processor 50, first to apply a correction factor to obtain true power and then to provide a correction signal to RF generator 80 so as to provide the set power at load 90.

The true power as well as the true RMS voltage and true RMS current are processed through data processor 50 and provided at display 88. Comparing these data with the forward power and reflected power from lines 82 and 83 of generator 80, the magnitude and phase angle of the load impedance is also calculated and displayed. The magnitude of the load impedance is derived by the equation: $Z_{mag}=E_{rms}/I_{rms}$, where $Z_{mag}$ is the magnitude of the load impedance, $E_{rms}$ and $I_{rms}$ are the true root means square voltage and true root mean square current. The phase angle of the load impedance is derived by the equation: $Z_0=\mathrm{Arccos}[P_{real}/(E_{rms}\times I_{rms})]$, where $Z_0$ is the phase angle of the load impedance and $P_{real}$ is the true power. These derivations are performed in data processor 50 under software control.

Connection 87 to display terminal 88 is typically an RS-232 serial port capable of bidirectional communication with a variety of devices.

The DC bias parameter from tap 26 is the DC level that is self-induced by a plasma load. It is often a critical process controlling parameter in plasma deposition processes and is made available for that and other purposes.

While the invention has been described in relation to a specific embodiment and use, it is to be understood that variations within the skill of the art are contemplated as included in the invention. For example, much of the processing performed by data processor 50 can be hard wired. With sufficient control of mass manufacture, correction factors can be hard wired for true readings. It is also possible to use other sensors than toroid transformers and direct soldered connections. Thus, it is the intention to cover the invention as set forth in the following claims.

We claim:

1. A method of monitoring electrical parameters of an RF plasma comprising:

a. connecting an RF generator to a plasma chamber containing a work product;

b. connecting a sensing head in series between said generator and said chamber;

c. sensing DC bias voltage, RF voltage and RF current in said sensing head;

d. processing the sensed voltages and current to provide real power data at the plasma chamber input;

e. feeding back control data to the RF generator to keep power at the plasma chamber input constant.

2. A method of monitoring an RF plasma according to claim 1 further comprising the step of matching the impedance of said RF generator to the impedance at the plasma chamber input with an impedance matching network positioned between said generator and said sensing head.

3. A method of monitoring an RF plasma according to claim 2 wherein said RF plasma performs physical processing on the work product in said plasma chamber.

4. A method of monitoring an RF plasma according to claim 2 further comprising reducing the RF frequency to 1 mhz or less by sample and hold means driven by an oscillator all in said sensing head.

5. A method of monitoring an RF plasma according to claim 4 wherein said sample and hold means is a microwave switch followed by a lowpass filter and said oscillator has a square wave output turning said microwave switch on and off while said filter includes capacitors holding the output of said switch.

6. A method of monitoring an RF plasma according to claim 2 wherein said processing includes deriving load impedance magnitude and phase from RMS voltage, RMS current and true power.

7. An RF power monitor for monitoring electrical parameters at an RF load comprising:

a. a sensing head connectable in series in an RF transmission line between an RF generator and the load;

b. taps within said sensing head for detecting RF voltage and RF current;

c. waveform sampling means within said sensing head for reducing the frequency of the RF voltage and the RF current signals detected to a reduced frequency not exceeding 1 MHZ;

d. a processing unit connected to said sensing head and comprising:

(1) a multiplier of said RF voltage and RF current at said reduced frequency to provide power;

(2) an integrator changing said power to an analog signal;

(3) an A to D converter changing said analog signal to a digital signal;

(4) a digital data processor which subtracts offset and applies a gain constant to give true power.

8. An RF power monitor according to claim 7 further comprising an impedance matching network connected between said RF generator and said sensing head for matching the impedance of said RF generator to said load.

9. An RF power monitor according to claim 8 wherein said waveform sampling means comprises an oscillator unit producing a square wave output and a microwave switch operated by said square wave to pass samples of the reduced RF frequency.

10. An RF power monitor according to claim 8 further comprising analog to digital converter means connecting the signal representing the RF voltage at reduced frequency to said digital data processor.

11. An RF power monitor according to claim 10 further comprising analog to digital converter means connecting the signal representing the RF current at reduced frequency to said digital data processor.

12. An RF power monitor according to claim 11 further comprising RMS conversion means prior to the analog to digital converters for both the signals representing said RF voltage and RF current.

13. An RF power monitor according to claim 8 wherein a further tap within said sensing head is a tap for sensing direct current bias on said RF transmission line.

* * * * *